United States Patent
Kang et al.

(10) Patent No.: US 7,057,217 B2
(45) Date of Patent: Jun. 6, 2006

(54) FUSE ARRANGEMENT AND INTEGRATED CIRCUIT DEVICE USING THE SAME

(75) Inventors: Sang-Seok Kang, Suwon-shi (KR); Jong-Hyun Choi, Suwon-shi (KR); Sang-Ki Hwang, Sungnam-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/672,035

(22) Filed: Sep. 26, 2003

(65) Prior Publication Data

US 2004/0108572 A1 Jun. 10, 2004

(30) Foreign Application Priority Data

Sep. 27, 2002 (KR) .................. 10-2002-0058677

(51) Int. Cl.
*H01L 27/10* (2006.01)

(52) U.S. Cl. ................. 257/209; 257/529; 257/530; 257/665

(58) Field of Classification Search ........ 257/529–530, 257/665, 208–209
See application file for complete search history.

(56) References Cited

U.S. PATENT DOCUMENTS

| | | | |
|---|---|---|---|
| 5,636,172 A | 6/1997 | Prall et al. ............... | 365/225.7 |
| 5,773,869 A | 6/1998 | Froehner .................... | 257/529 |
| 6,172,896 B1 * | 1/2001 | Lee .............................. | 365/96 |
| 6,803,612 B1 * | 10/2004 | Lehr et al. ................... | 257/209 |

* cited by examiner

*Primary Examiner*—Thien F. Tran
(74) *Attorney, Agent, or Firm*—Mills & Onello LLP

(57) ABSTRACT

A fuse circuit according to the present invention includes first and second fuses, each of which has a first end and a second end. The first and second ends of the first fuse are connected in a straight line. The first end of the second fuse is spaced by a first interval from the first end of the first fuse, and the second end thereof is spaced by a second interval from the second end of the first fuse. The first ends of the first and second fuses have the same widths as those of the second ends thereof. Alternatively, the first ends of the first and second fuses have narrower widths that those of the second ends thereof.

16 Claims, 13 Drawing Sheets

FUSE ARRANGEMENT AND INTEGRATED CIRCUIT DEVICE USING THE SAME

This application relies from priority upon Korean Patent Application No. 2002-58677, filed on Sep. 27, 2002, the contents of which are herein incorporated by reference in their entirety.

FIELD OF THE INVENTION

The present invention is directed to an integrated circuit device and in particular to arrangement of fuses in the integrated circuit device as a semiconductor element.

BACKGROUND OF THE INVENTION

An integrated circuit is a complete electronic circuit, containing transistors, diodes, resistors, and capacitors, along with their interconnecting electrical conductors, contained entirely within a single chip of silicon. Integrated circuits continue to decrease in size, and the circuits they contain continue to increase in complexity. This increases the opportunity for defective chips resulting from a failed element or a defective conductor. The complexity of these devices and the need to interconnect the circuits create very narrow performance tolerances. One way these needs have been met is to manufacture fuses into the device. Fuses can be opened to isolate defective areas and allow the rest of the circuit to be used. Fuses can also be used to trim a circuit, enable a particular mode, or enable or disable different segments of the circuit.

Another way to reduce semiconductor scrap is to provide redundant elements on integrated circuits. If a primary element is defective, a redundant element can be substituted for that defective element. One example of an integrated circuit device which uses redundant elements is electronic memory. Typical memory circuits comprise millions of equivalent memory cells arranged in addressable rows and columns.

Because the individual primary memory cells of a memory are separately addressable, replacing a defective cell typically comprises opening a fuse circuit to program a redundant cell to respond to the address of the defective primary cell. The fuse circuit includes a plurality of fuses for storing defective addresses. As well known to those skilled in the art, defective addresses can be stored in the fuse circuit through selective opening of fuses therein. If a presently input address is identical to any defective address in the fuse circuit, a redundant memory cell is selected instead of a defective memory cell. The fuse circuit is disposed adjacent to a row select circuit for selecting rows (or word lines) of memory cells.

Referring to FIG. 1 which shows a fuse arrangement according to the prior art, fuses 11, 12, 13, 14, 15 and 16 are disposed in parallel along a row direction and at a cutting region 17. The fuses 11–16 have the same widths W, and a pitch P between adjacent fuses is the same. This fuse arrangement has the following problem. As a unit memory cell is scaled down in size a length (or a width) in a row direction is increasingly reduced. Word lines are arranged in parallel within the length in a row direction. On the other hand, since a fuse pitch is dependant on a capacity of a device for emitting a laser beam, it is actually difficult to reduce length of a fuse circuit in a row direction or fuse pitch. Thus, to dispose a fuse circuit within a reduced length in a row direction makes redundant word lines decrease in number.

In order to overcome the above problems, there was proposed a two-layer fuse arrangement which divides one cutting region into two regions and disposes the divided regions to have a two-layer structure. An example of the two-layer fuse-arrangement is disclosed in U.S. Pat. No. 5,773,869, entitled "DOUBLE DENSITY FUSE BANK FOR THE LASER BREAK-LINK PROGRAMMING OF AN INTEGRATED CIRCUIT". FIG. 2 shows a fuse arrangement disclosed in the '869 patent. As shown in FIG. 2, cutting regions 26 of fuse elements 22A and 22B are disposed in two columns, not in a single column. This fuse arrangement enables increase in distance or pitch between adjacent cutting regions 26 in the same column. This means that more fuses are disposed within the same length.

Other examples of the two-layer structure are disclosed U.S. Pat. No. 5,636,172 entitled "REDUCED PITCH LASER REDUNDANCY FUSE BANK STRUCTURE" and U.S. Pat. No. 6,172,896 entitled "LAYOUT ARRANGEMENT OF FUSE BOXES FOR INTEGRATED CIRCUIT DEVICES, INCLUDING BENT AND STRAIGHT FUSES". Fuse structures disclosed in the '172 and '896 patents are illustrated in FIGS. 3 and 4. As illustrated in FIGS. 3 and 4, each of fuses 18, 19, 20, 18', 19', 20', 23, 24, 25, 23', 24' and 25' has a narrow portion and a wide portion. Spaced-apart distances of wide portions of the fuses are wider than those of narrow portions thereof.

With fuse structures in FIGS. 3 and 4, the portion of the fuse pattern that is opened by a laser beam is large compared to the portion that is not opened by laser. This results in the fuse circuit having a relatively large length.

SUMMARY OF THE INVENTION

It is therefore an object of the invention to provide a fuse arrangement capable of reducing length of a fuse circuit and improving operating speed.

It is another object of the invention to provide a semiconductor memory device adopting the fuse arrangement.

In accordance with one aspect of the present invention, there is provided a fuse arrangement which comprises a first fuse having a first end and a second end and a second fuse having a first end and a second end. The first end of the first fuse is spaced by a first interval from the first end of the second fuse, and the second end of the first fuse is spaced by a second interval from the second end of the second fuse. The first ends of the first and second fuses have narrower widths than those of the second ends of the first and second fuses. Alternatively, the first ends of the first and second fuses have identical widths to those of the second ends of the first and second fuses.

Preferably, the first interval is wider than the second interval and the first ends of the first and second fuses are disposed at a cutting region. The first and second ends of the first and second fuses can be disposed in a row direction. The first and second ends of the first fuse can be connected in a straight line and the first end of the second fuse is laterally offset from the second end of the second fuse.

In this embodiment, the fuse arrangement can further comprise a third fuse and a fourth fuse, the first and second fuses forming a first fuse group and the third and fourth fuses forming a second fuse group. The second fuse group is positioned such that the second fuse group is adjacent to the first fuse group and the second fuse group is rotated one hundred eighty (180) degrees from the first fuse group.

The first ends of the first and second fuses can be vertically connected to the second ends of the first and second fuses, respectively. In accordance with another aspect of the invention, there is provided a fuse arrangement comprising a first fuse having a first end and a second end connected in a straight line and a second fuse having a first end and a second end connected in a straight line. A third fuse has a first end spaced by a first interval from the first end of the first fuse and a second end spaced by a second interval from the second end of the first fuse, the first end of the third fuse being laterally offset from the second end thereof. A fourth fuse has a first end spaced by the first interval from the first end of the second fuse and a second end spaced by the second interval from the second end of the second fuse, the first end of the fourth fuse being laterally offset from the second end thereof. The first ends of the first and third fuses have widths narrower than or identical to those of the second ends of the second and fourth fuses.

In one embodiment, the first ends of the first to fourth fuses are disposed parallel in one row direction and the second ends of the first to fourth fuses are disposed parallel in another row direction.

In one embodiment, the first interval is wider than the second interval.

In one embodiment, the first ends of the first and third fuses are disposed at a first cutting region formed along a first row and the second ends of the second and fourth fuses are disposed at a second cutting region formed along a second row.

In accordance with another aspect of the invention, there is provided a fuse arrangement comprising a first fuse group including a plurality of first fuses each having a first end and a second end, wherein the first ends of the first fuses are spaced from one another, the first and second ends of one of the first fuses being connected in a straight line, and the first ends of remaining ones of the first fuses being laterally offset from the second ends thereof. A second fuse group includes a plurality of second fuses each having a first end and a second end, wherein the first ends of the second fuses are spaced by a first interval from one another, the second ends of the second fuses are spaced by a second interval from one another, the first and second ends of one of the second fuses are connected in a straight line, and the first ends of remaining ones of the second fuses become laterally offset from the second ends thereof. The first and second fuses having the first and second ends connected in a straight line are disposed to encompass the remaining of the first and second fuses. The first ends of the first and second fuses in the first and second fuse groups have widths narrower than or identical to those of the second ends thereof.

In one embodiment, the first ends of the first and second fuses are disposed parallel in one row direction and the second ends of the first and second fuses are disposed parallel in another row direction.

In one embodiment, the first interval is wider than the second interval, the first ends of the first fuses are disposed at a first cutting region formed along a first row, and the second ends of the second fuses are disposed at a second cutting region formed along a second row.

In accordance with another aspect of the present invention, there is provided a fuse arrangement which comprises first fuse segments spaced by a first interval from each other and second fuse segments each corresponding to the first fuse segments and disposed at a cutting region, the second fuse segments being spaced by a second interval from each other. A common connection line is connected to the second fuse segments. The first fuse segments are orthogonally connected to second corresponding fuse segments, respectively, the second interval is wider than the first interval, and a width of each of the second fuse segments is narrower than that of each of the first fuse segments. Alternatively, a width of each of the second fuse segments is identical to that of each of the first fuse segments.

In one embodiment, the fuse arrangement further comprises a fuse group having a third fuse segment and a fourth fuse segment and disposed adjacent to a fuse group of the first and second fuse segments so as to have a symmetrical shape. The third and fourth fuse segments can be disposed to have the same structure as the first and second fuse segments.

In another embodiment, the fuse arrangement further comprises a fuse group which has a third fuse segment and a fourth fuse segment and is disposed adjacent to a fuse group of the first and second fuse segments and the common connection line so as to have a symmetrical shape. The third and fourth fuse segments can be disposed to have the same structure as the first and second fuse segments.

In one embodiment, the first fuse segments are disposed parallel along a row direction and the second fuse segments are disposed parallel along a column direction.

In accordance with another aspect of the invention, there is provided a fuse arrangement comprising a first fuse and a second fuse that are disposed at a first fuse region and are spaced by a first interval from each other. A first signal line and a second signal line are connected to the first and second fuses respectively and are spaced by a second interval from each other. A third fuse and a fourth fuse are disposed at a second fuse region and are spaced by the first interval from each other. A third signal line and a fourth signal line are connected to the third and fourth fuses respectively and are spaced by the second interval from each other. The first and second signal lines are disposed adjacent to the second fuse region, the third and fourth signal lines are disposed adjacent to the first fuse region, and the first interval is wider than the second interval.

In one embodiment, the first signal line is connected to one end of the first fuse in a straight line and the second signal line is connected to the second fuse so as to become laterally offset by a predetermined angle from one end of the second fuse.

In accordance with another aspect of the present invention, there is provided a semiconductor memory device which comprises an array of memory cells arranged in rows and columns and a redundant array for replacing defective memory cells. A plurality of fuse boxes store defect addresses, respectively. Each fuse box includes a first fuse having a first end and a second end connected in a straight line and a second fuse having a first end spaced by a first interval from the first end of the first fuse and a second end spaced by a second interval from the second end of the first fuse. The first ends of the first and second fuses are disposed at a cutting region along a row direction, the first end of the second fuse is laterally offset from the second end of the second fuse, and the first ends of the first and second fuses have narrower widths than those of the first and second fuses. Alternatively, the first ends of the first and second fuses have identical widths to those of the first and second fuses.

Preferably, each fuse box further comprises a second fuse group having third and fourth fuses. The second fuse group is positioned such that a first fuse group of the first and second fuses is adjacent to the second fuse group. The second fuse group is rotated one hundred eighty (180) degrees from the first fuse group.

The third and fourth fuses can be disposed to have the same structure as the first and second fuses.

In accordance with another aspect of the invention, there is provided a semiconductor memory device comprising a plurality of word lines arranged in parallel in a row direction and a plurality of bit lines arranged in parallel in a column direction. A plurality of memory cells are connected to the word lines and the bit lines. A plurality of fuse boxes store defective address information. A row select circuit selects one of the word lines in response to decoded signals. First signal lines are connected to the row select circuit and the fuse boxes and are disposed at one side of the fuse boxes. Second signal lines are connected to the row select circuit and are disposed at the one side of the fuse boxes. Third signal lines are connected to the fuse boxes and disposed at the other side of the fuse boxes.

In one embodiment, the second and third signal lines transfer the same signals.

In one embodiment, loading of the second and third signal lines is more than that of the first signal lines.

In one embodiment, the plurality of fuse boxes include a first fuse box group disposed in a row direction and a second fuse box group positioned such that the second fuse box group is disposed adjacent to the firs fuse box group and the second fuse box group is rotated one hundred (180) degrees from the first fuse box group.

In one embodiment, the first signal lines are connected to the first fuse box group and the third signal lines are connected to the second fuse box group.

In one embodiment, the third signal lines are the same as the second signals.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENT

In integrated circuits, generally, size and space of a fuse portion at which no laser beam is irradiated are determined by minimum spacing and conductor design rules, and size and space of a fuse portion at which a laser beam is irradiated are determined by laser fuse spacing and width design rules. Based on these conditions, preferred embodiments of the present invention will be described more fully below.

Figure 5:
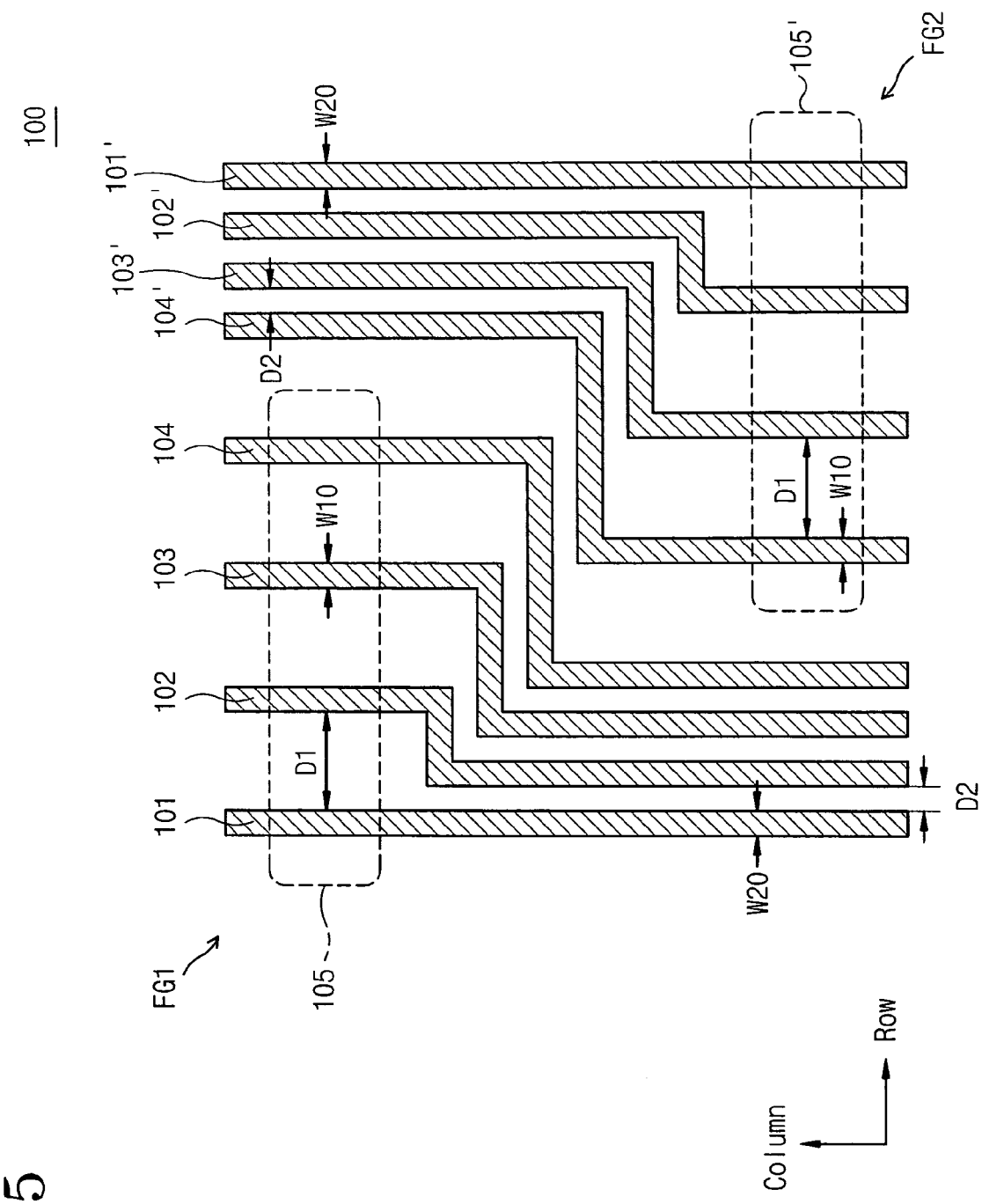
FIGS. 5 to 10 contain diagrams of embodiments of a fuse arrangement according to the present invention.

FIG. 5 shows a fuse arrangement according to a first embodiment of the present invention. Referring to FIG. 5, a fuse bank 100 of the present invention comprises a first fuse group FG1 and a second fuse group FG2. The first fuse group FG1 includes a plurality of, for example, four fuses 101, 102, 103 and 104, each of which has a first end and a second end. The first ends of the fuses 101 to 104 in the first fuse group FG1 are spaced apart from one another by a first interval D1 and disposed in parallel at a cutting region 105. The second ends of the fuses 101 to 104 are spaced apart from one another by a second interval D2. The first and second ends of the fuse 101 are connected in a straight line. In contrast, the second ends of the fuses 102 to 104 are laterally offset from the first ends of the fuses 102 to 104. The first interval D1 is wider than the second interval D2. The first ends of the fuses 101 to 104 in the first fuse group FG1 are selectively cut by irradiation of a laser beam.

Figure 6A:
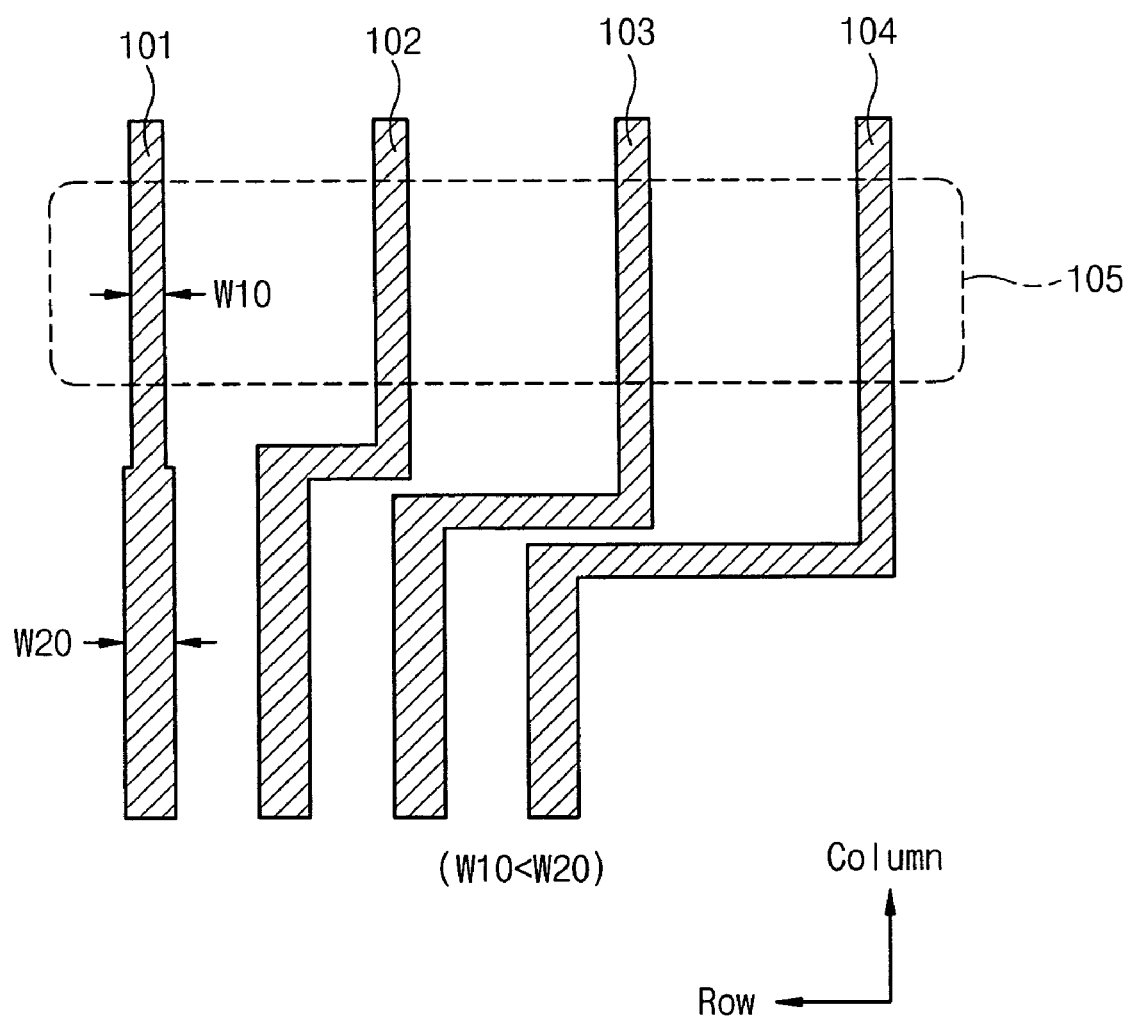

With the advance of laser techniques, widths W10 of the first ends of the fuses 101–104 in the first fuse group FG1 can be formed nearly the same as widths W20 of the second ends thereof. As illustrated in FIG. 6A, alternatively, widths W10 of the first ends of the fuses 101–104 in the first fuse group FG1 can be formed narrower than the widths W20 of the second ends thereof. This reduces the length of the cutting region, resulting in a decrease in memory chip size. The first ends of the fuses 101–104 in the first fuse group FG1 are disposed vertically to a row direction.

Returning to FIG. 5, the second fuse group FG2 includes four fuses 101', 102', 103' and 104'. As illustrated in FIG. 5, the second fuse group FG2 is rotated one hundred eighty degrees from the first fuse group FG2 such that the second fuse group FG2 has the same shape as the first fuse group FG1. Each of the fuses 101'–104' in the second fuse group FG2 has first and second ends. The first ends of the fuses 101'–104' in the second fuse group FG2 are spaced apart from one another by a first interval D1 and are disposed in parallel at a cutting region 105'. The second ends of the fuses 101'–104' are spaced apart from one another by a second interval D2. The first and second ends of the fuse 101' are connected in a straight line. In contrast, the second ends of the fuses 102'–104' are laterally offset from the first ends thereof. The first ends of the fuses 101'–104' are selectively cut by irradiation of a laser beam.

Figure 6B:
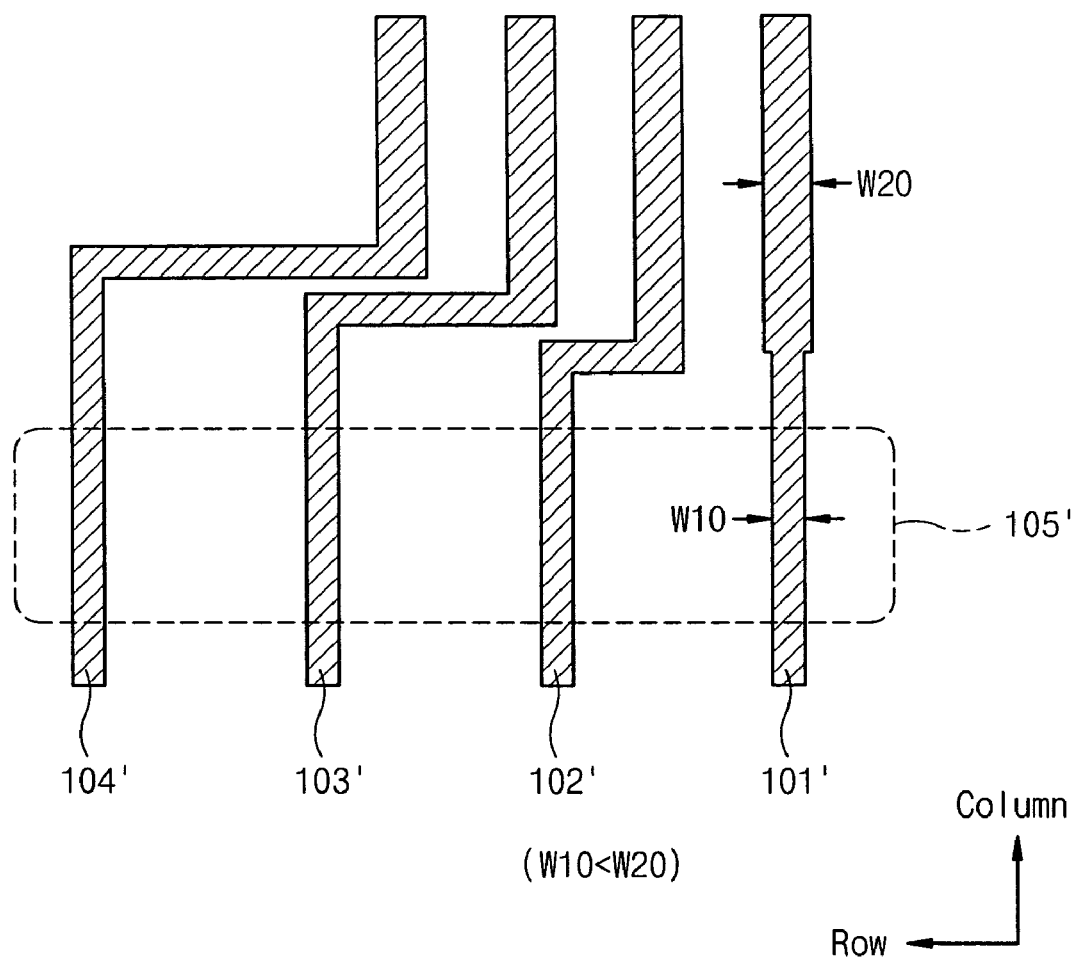

Widths W10 of the first ends of the fuses 101'–104' in the second fuse group FG2 can be formed nearly the same as the widths W20 of the second ends thereof. Alternatively, as illustrated in FIG. 6B, widths W10 of the first ends of the fuses 101'–104' in the second fuse group FG2 can be formed narrower than the witdths W20 of the second ends thereof. The first ends of the fuses 101'–104' in the second fuse group FG2 are disposed vertically to a row direction. Although not shown in a figure, the first and second fuse groups in FIG. 5 are repeatedly disposed in a row direction.

Figure 1:
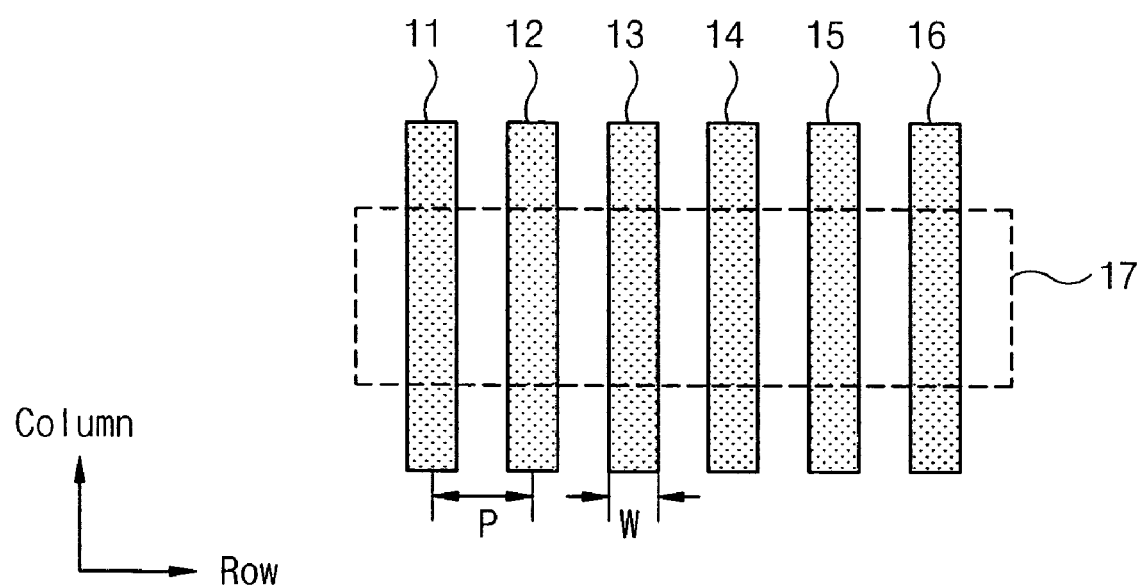
FIGS. 1 to 4 contain diagrams of a fuse arrangement according to the prior art.
Figure 2:
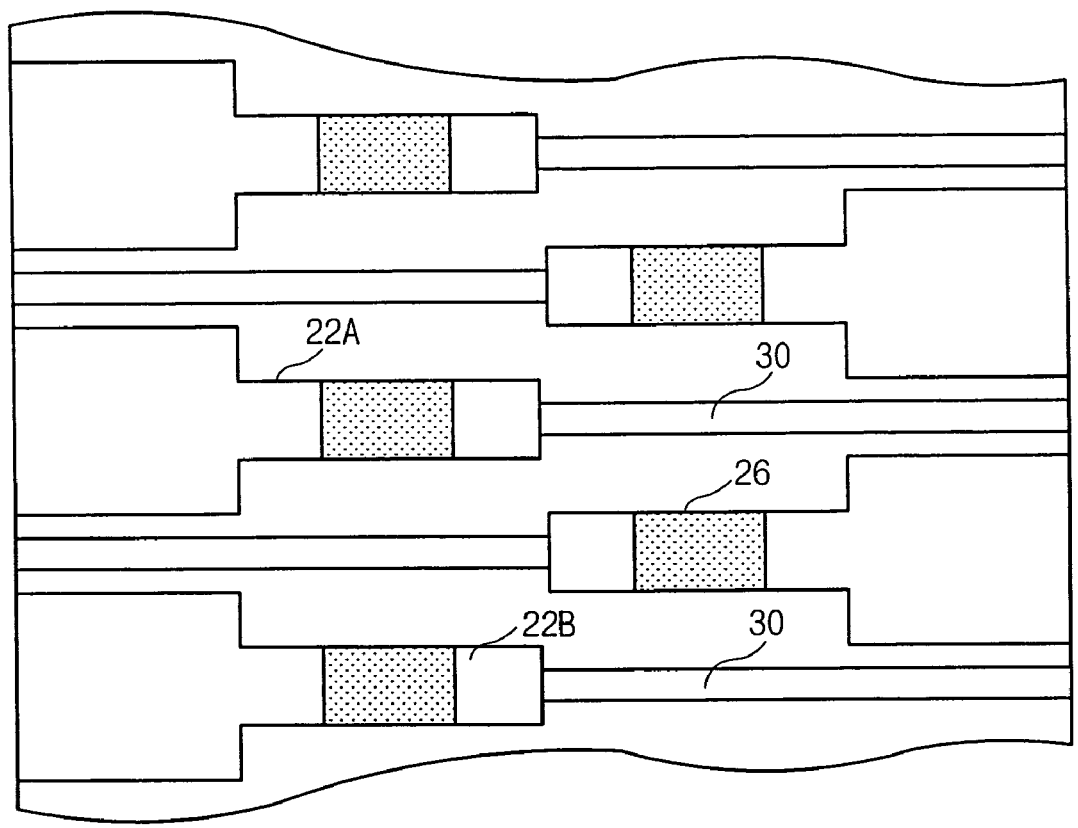
Figure 3:
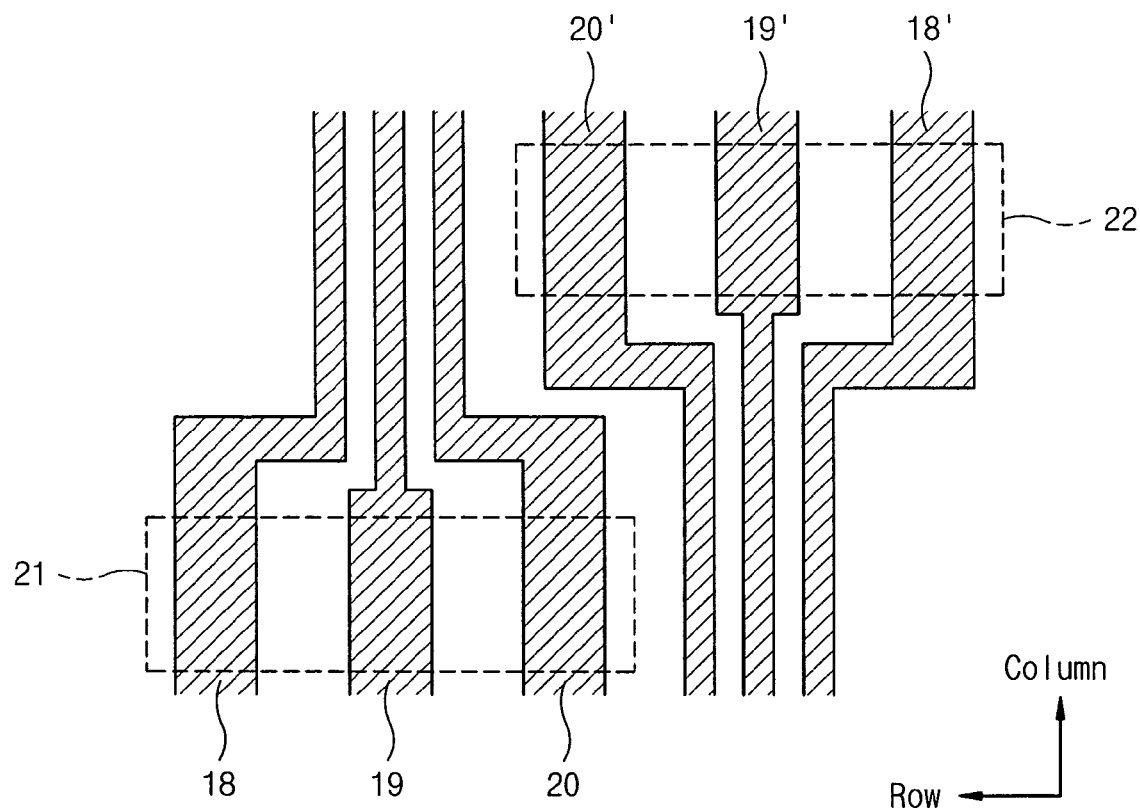
Figure 4:
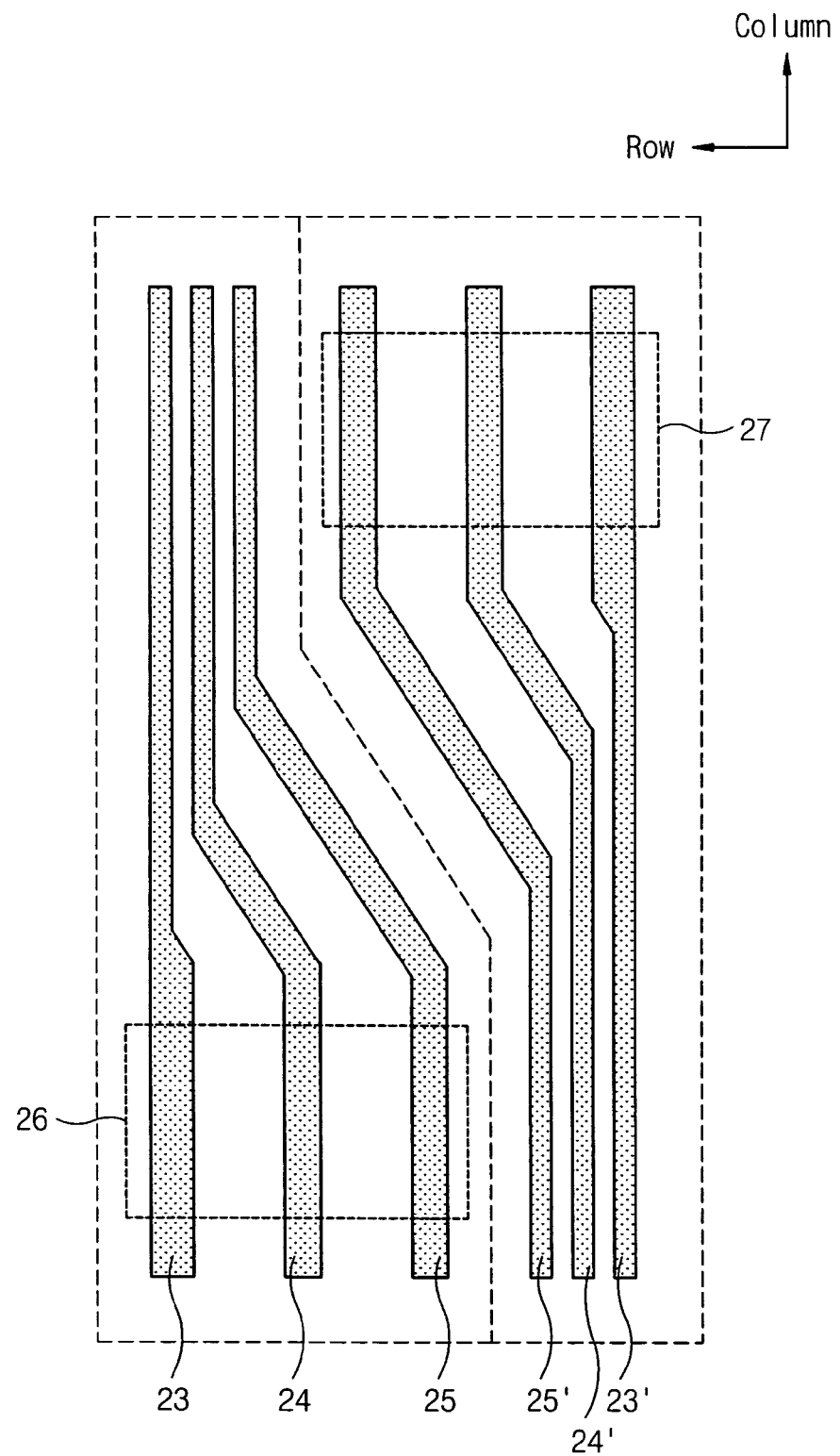

With a fuse arrangement illustrated in FIG. 5, since the width W10 of each end of the respective fuse groups is relatively small when compared with that in FIGS. 3 and 4, the fuse-group length in a row direction can be reduced while maintaining a width between adjacent fuses the same.

Figure 7:
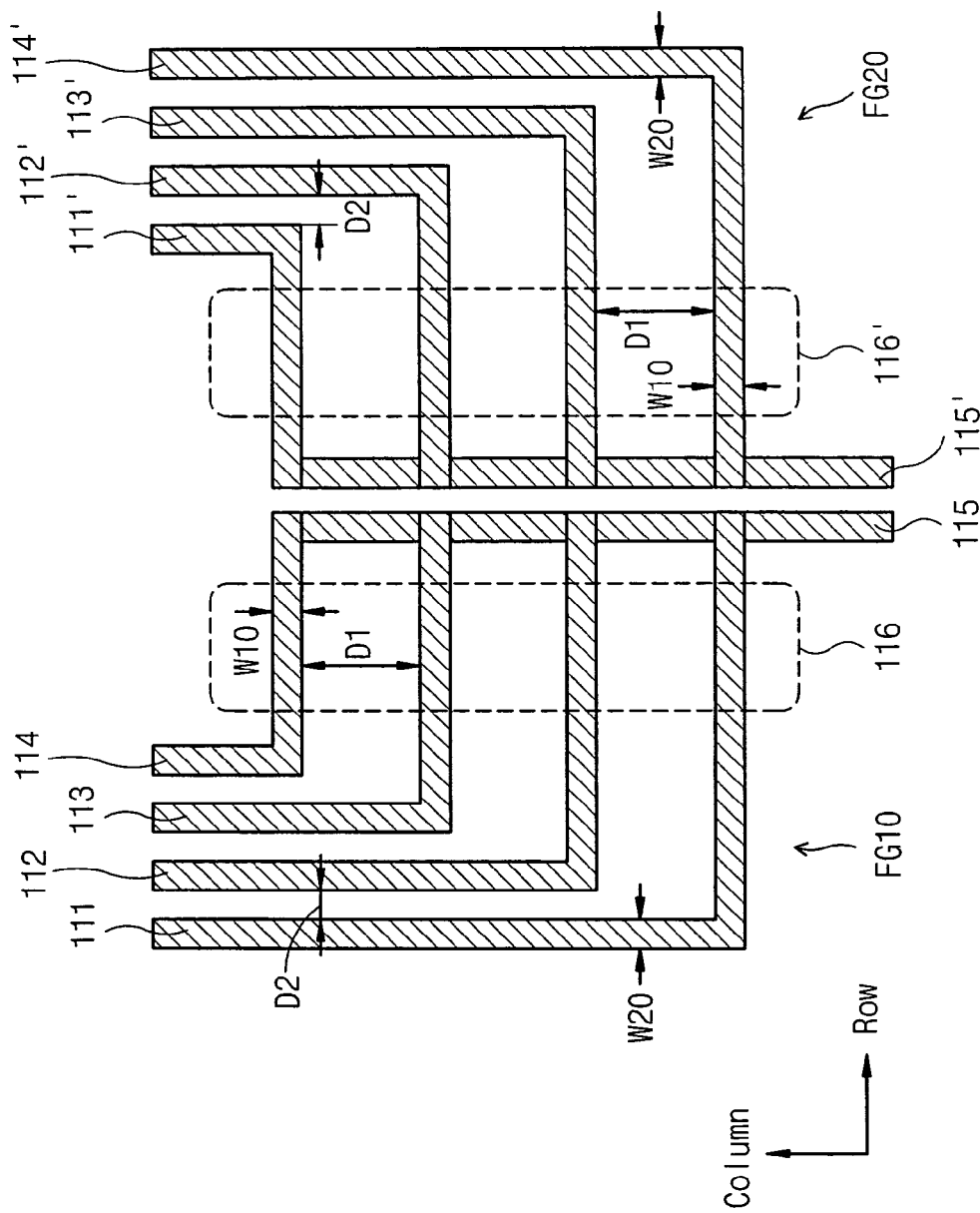

FIG. 7 shows a fuse arrangement according to a second embodiment of the present invention. Referring to FIG. 7, a fuse bank 100' according to the second embodiment comprises a first fuse group FG10 and a second fuse group FG20. The first fuse group FG10 includes four fuses 111, 112, 113 and 114 and a common connection line 115. The fuses 111–114 in the first fuse group FG10 are divided into two fuse segments, respectively. That is, the fuses 111–114 in the first fuse group FG10 have a first end and a second end, respectively. The first ends of the fuses 111–114 are spaced apart from one another by a first interval D1 and disposed in parallel at a cutting region 116. The first ends of the fuses 111–114 are connected commonly to the common connection line 115. The second ends of the fuses 111–114 are spaced apart from one another by a second interval D2, and are correspondingly connected to the first ends of the fuses 111–114 so as to be angled 90 degrees with respect to the first ends of the fuses 111–114.

In this embodiment, widths W10 of the first ends of the fuses 111–114 in the first fuse group FG10 can be formed nearly the same as those W20 of the second ends thereof. Alternatively, widths W10 of the first ends of the fuses 111–114 in the first fuse group FG10 can be formed narrower than those W20 of the second ends thereof.

Continuing to refer to FIG. 7, the second fuse group FG20 includes four fuses 111', 112', 113' and 114' and a common connection line 115', and is disposed to have a mirror shape to the first fuse group FG10 as illustrated in FIG. 7. Except that the second fuse group FG20 has a mirror shape to the first fuse group FG10, the second fuse group FG20 is identical to the first fuse group FG10, and description thereof is thus omitted.

With a fuse arrangement illustrated in FIG. 7, since a width W10 of each end of the respective fuse groups is shrunk compared with that in FIGS. 3 and 4, a fuse-group length into a row direction can be reduced while maintaining a width between adjacent fuses the same. Furthermore, fuses at the cutting region 116 are disposed in a column direction, not in a row direction as illustrated in FIG. 5. This enables a designer to reduce a chip size easily through a change of an inner circuit structure.

Figure 8:
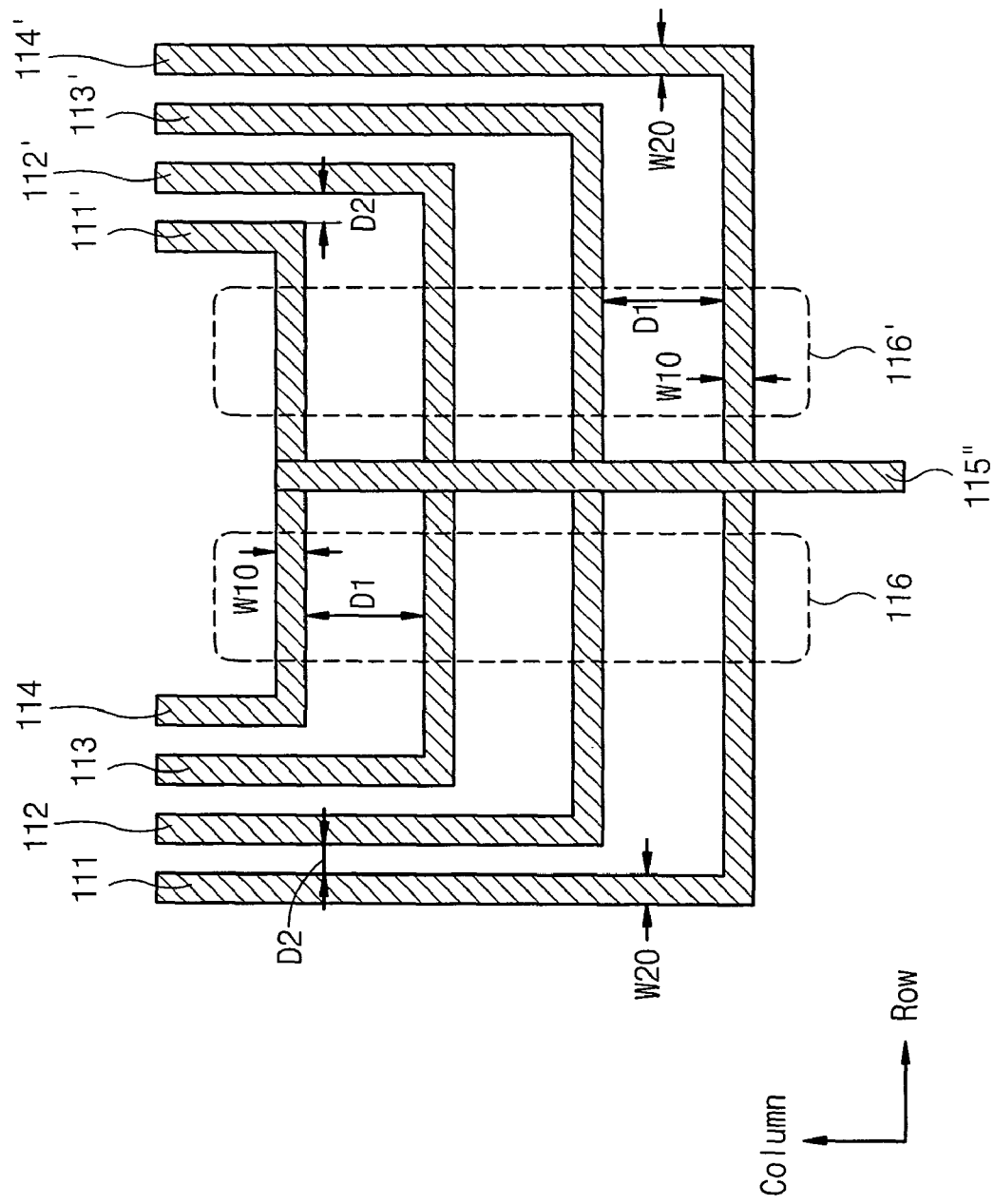

In FIG. 7, two common connection lines 115 and 115' are used corresponding to the first and second fuse groups FG10 and FG20. Furthermore, as illustrated in FIG. 8, the fuse bank can be configured such that one common connection line 115" is shared by the first and second fuse groups FG10 and FG20. In FIG. 8, constituent elements that are substantially identical to those in FIG. 7 are marked by the same reference numbers, and description thereof is not repeated.

Figure 9:
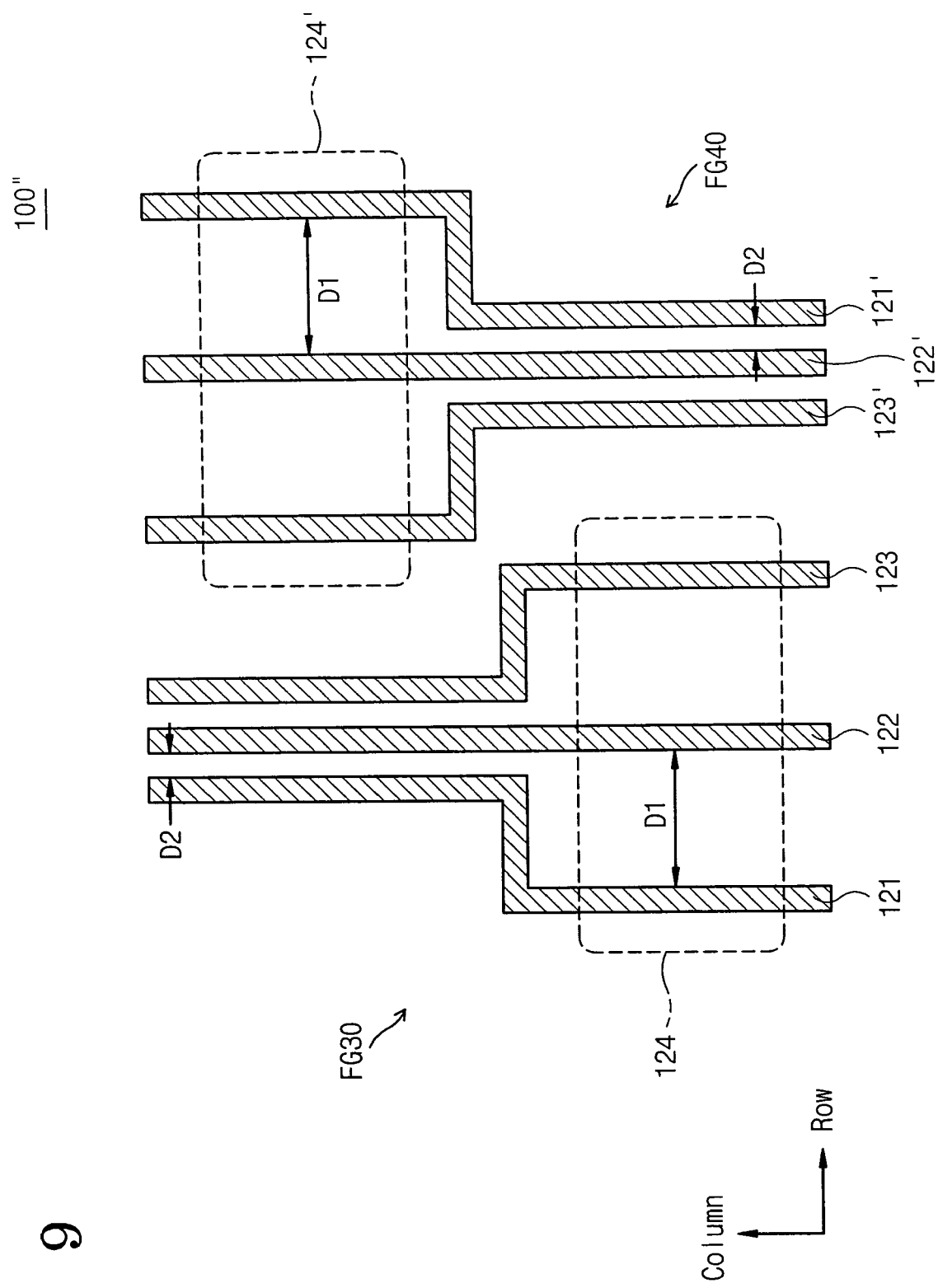

FIG. 9 illustrates a fuse arrangement according to a third embodiment of the present invention. Referring to FIG. 9, a fuse bank 100" according to the third embodiment comprises a first fuse group FG30 and a second fuse group FG40. The first fuse group FG30 includes three fuses 121, 122 and 123, each of which has a first end and a second end. The first ends of the fuses 121–123 are spaced apart from one another by a first interval D1 and disposed in parallel at a cutting region 124. The second ends of the fuses 121–123 are spaced apart from one another by a second interval D2. The first and second ends of the fuse 122 are connected in a straight line. The second end of a left-handed fuse 121 is laterally offset from the first end thereof and is spaced apart from the second end of the fuse 122 by the second interval D2. The second end of a right-handed fuse 123 is laterally offset from the first end thereof and is spaced apart from the second end of the fuse 122 by the second interval D2.

Preferably, the first interval D1 is wider than the second interval D2. Widths W10 of the first ends of the fuses 121–123 in the first fuse group FG30 can be formed nearly the same as widths W20 of the second ends thereof. Alternatively, widths W10 of the first ends of the fuses 121–123 in the first fuse group FG30 can be formed narrower than widths W20 of the second ends thereof.

The second fuse group FG40 includes three fuses 121', 122' and 123', each of which has a first end and a second end. The first ends of the fuses 121'–123' are spaced apart from one another by the first interval D1 and disposed in parallel at a cutting region 124'. The second ends of the fuses 121'–123' are spaced apart from one another by the second interval D2. The first and second ends of the fuse 122' are connected in a straight line. The second end of a right-handed fuse 121' is laterally offset from the first end thereof and is spaced apart from the second end of the fuse 122' by the second interval D2. The second end of a left-handed fuse 123' is laterally offset from the first end thereof and is spaced apart from the second end of the fuse 122 by the second interval D2.

Preferably, widths W10 of the first ends of the fuses 121'–123' in the second fuse group FG40 can be formed nearly the same as widths W20 of the second ends thereof. Alternatively, widths W10 of the first ends of the fuses 121'–123' in the second fuse group FG40 can be formed narrower than widths W20 of the second ends thereof.

Figure 10:
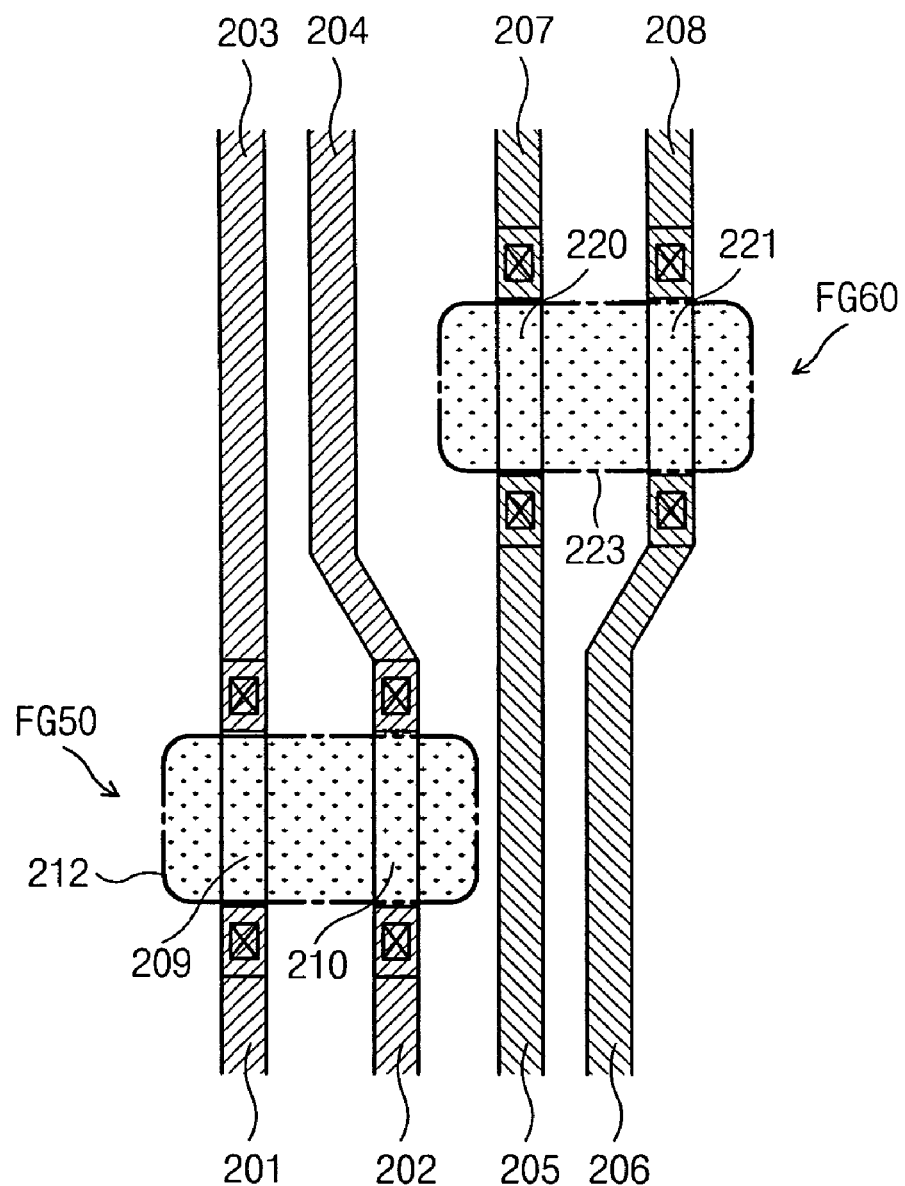

FIG. 10 shows a fuse arrangement according to a fourth embodiment of the present invention. Referring to FIG. 10, a fuse bank 200 according to the present invention comprises a first fuse group FG50 and a second fuse group FG60. The first fuse group FG50 includes two fuses 209 and 210 that are made of polysilicon. The fuse 209 is connected between signal or conductive lines 201 and 203, and the fuse 210 is connected between signal or conductive lines 202 and 204. In particular, ends of the fuse 209 are connected to the conductive lines 201 and 203 through corresponding contacts, and ends of the fuse 210 are connected to the conductive lines 202 and 204 through corresponding contacts. The conductive lines 201–204 are made of a metallic material having less resistance than that of polysilicon. The fuses 209 and 210 in the first fuse group FG50 are formed at a first fuse region 212 where a laser beam is irradiated.

The second fuse group FG60 includes two fuses 220 and 221 that are made of polysilicon. The fuse 220 is connected between signal or conductive lines 205 and 207, and the fuse 221 is connected between signal or conductive lines 206 and 208. In particular, ends of the fuse 220 are connected to the conductive lines 205 and 207 through corresponding contacts, and ends of the fuse 221 are connected to the conductive lines 206 and 208 through corresponding contacts. The conductive lines 205–208 are made of a metallic material having less resistance than that of polysilicon. The fuses 220 and 221 in the second fuse group FG60 are formed at a second fuse region 223 where a laser beam is irradiated.

As illustrated in FIG. 10, the signal lines 205 and 206 made of a metallic material are disposed at a right side of the first fuse region 212, and the signal lines 203 and 204 made of a metallic material are disposed at a left side of the second fuse region 223. A two-layer fuse arrangement in FIG. 10 enables decrease in delay time of a signal transfer line compared with fuse banks (e.g., fuse banks in FIGS. 2 to 9) where lines adjacent to fuse regions are made of polysilicon. The reason is because a metallic material has less resistance than polysilicon. This fuse structure is suitable to be applied to recent high-speed memory products.

Figure 11:
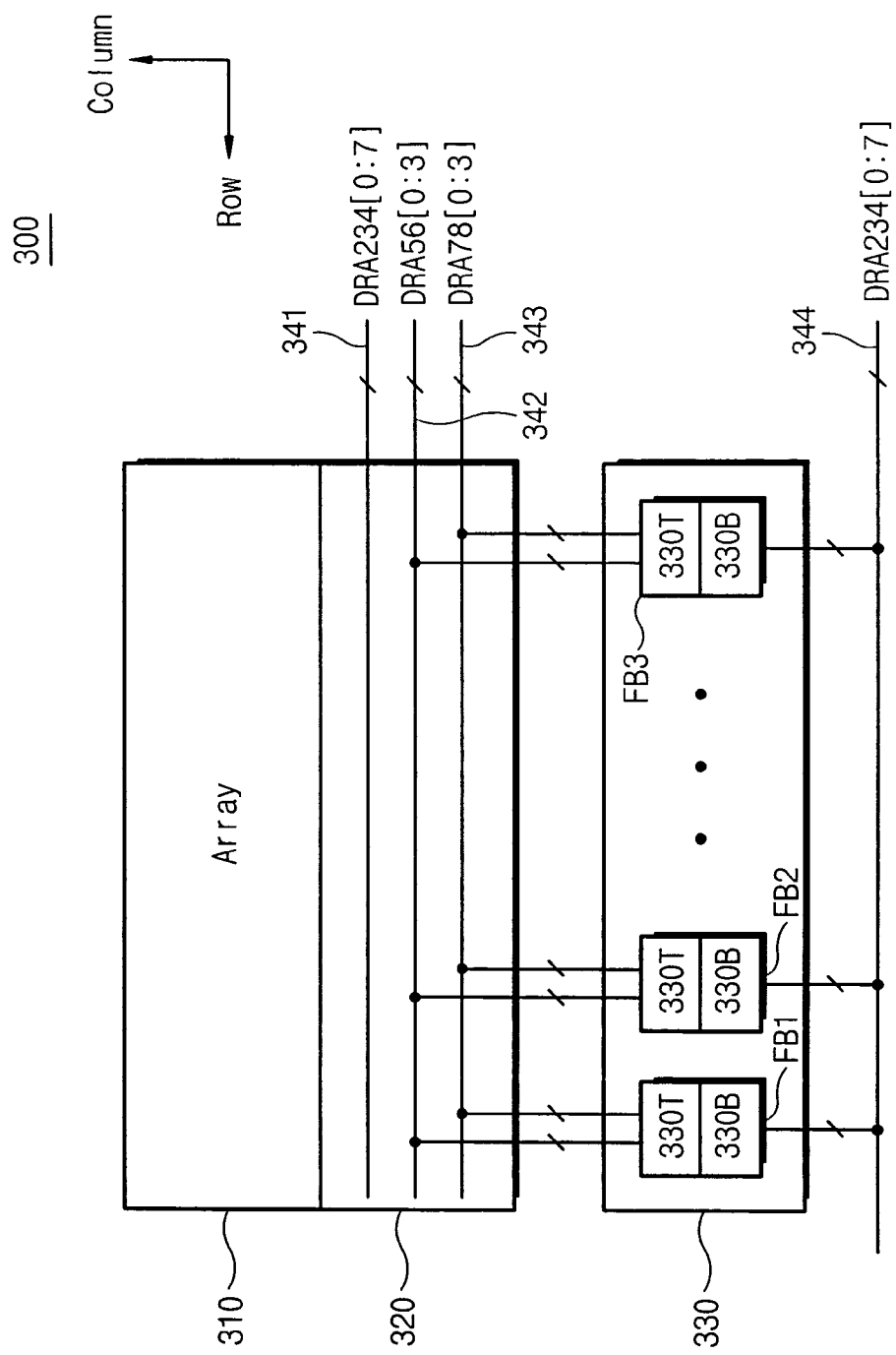
FIG. 11 contains a diagram of a semiconductor memory device adopting a fuse arrangement according to the present invention.

FIG. 11 is a block diagram of a semiconductor memory device adopting a fuse arrangement according to the present invention.

Referring to FIG. 11, a semiconductor memory device 300 according to the present invention comprises an array 310 which includes memory cells arranged in rows (or word lines) and columns (or bit lines). In FIG. 11, a direction marked by "ROW" is a direction where word lines are arranged in parallel, and a direction marked by "COLUMN" is a direction where bit lines are arranged in parallel. The array 310 further comprises a redundant cell array of redundant memory cells for replacing rows and/or columns of defective memory cells. A row select circuit 320 selects the word lines in response to first to third address signals DRA234[7:0], DRA56[3:0] and DRA78[3:0]. Signal lines for transferring the first to third address signals DRA234[7:0], DRA56[3:0] and DRA78[3:0] are arranged over the row select circuit 320.

Figure 12:
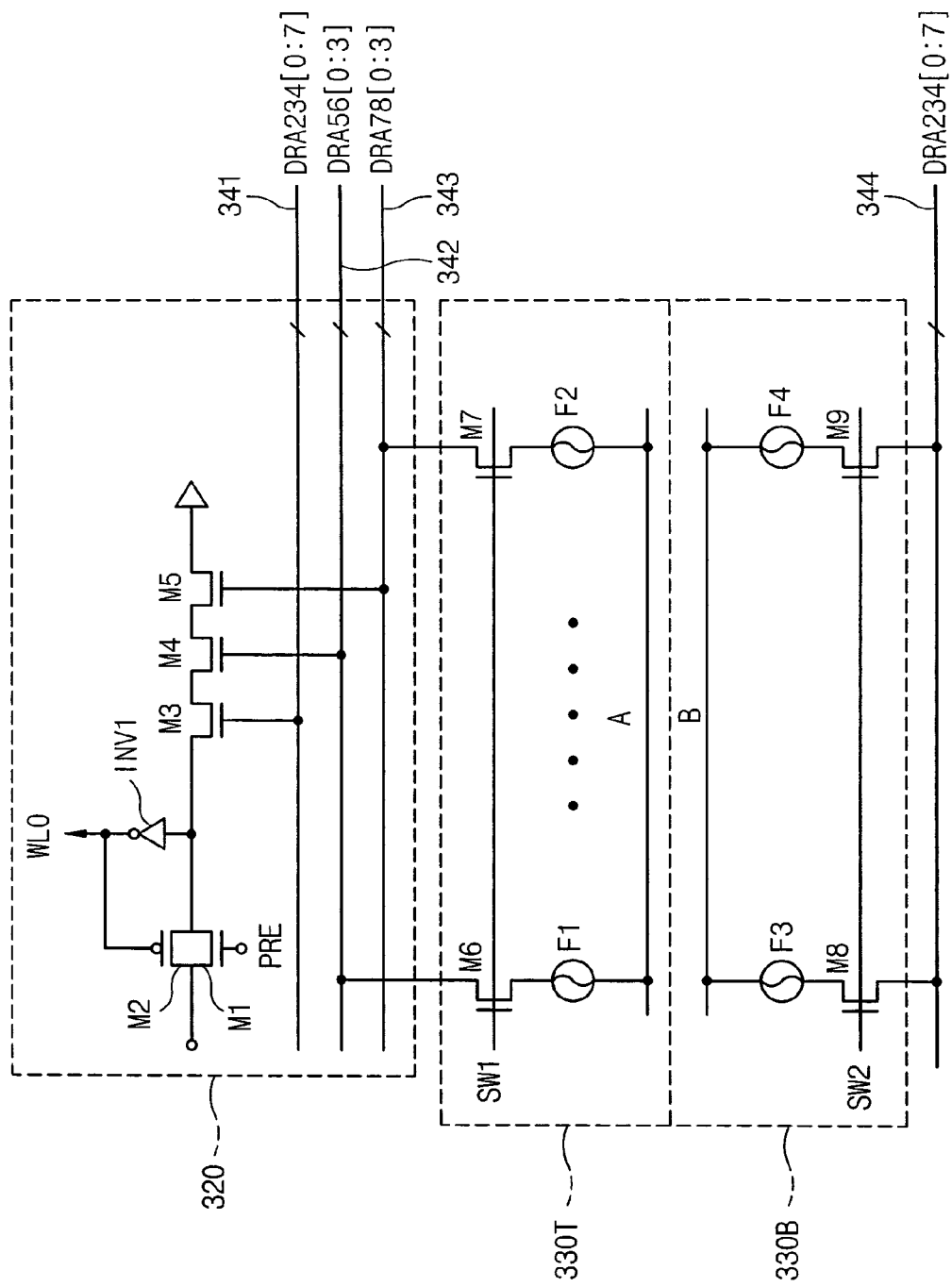
FIG. 12 contains a diagram of a fuse bank illustrated in FIG. 11 and a part of a row select circuit related to the fuse bank.

The semiconductor memory device 300 further comprises a fuse circuit 330, which includes a plurality of fuse banks FB1–FB3. The fuse banks FB1–FB3 store defective addresses, and are divided into two sub-fuse banks 330B and 330T. The sub-fuse bank 330T in each fuse bank is connected to signal lines 342 and 343 for transferring the address signals DRA56[3:0] and DRA78[3:0], while signal lines 341 for transferring the address signal DRA234[7:0] into the row select circuit 320 are not connected to the fuse circuit 330. But, the address signals DRA234[7:0] are supplied to the fuse circuit 330 through different signal lines 344. That is, the sub-fuse bank 330B in each fuse bank is connected to the signal lines 344, while the sub-fuse bank 330T in each fuse bank is connected to the signal lines 342 and 343, as illustrated in FIG. 11. A circuit diagram of the sub-fuse banks 330T and 330B and the row select circuit 320 is illustrated in FIG. 12. Fuses F1–F2 and F3–F4 in FIG. 12 are arranged according to one of the first to third embodiments of lo the present invention.

Considering address loading capacitance caused by a hierarchical decoding system of a row select circuit, the least significant bit address has relatively large capacitance while upper addresses have relatively small capacitance. In this case, since line loading of the least significant address (e.g., DRA234) is largest, the least significant address becomes an address of limiting a speed characteristic. This problem can be solved by disposing address signal lines having the largest line loading capacitance (e.g., address signal lines for transferring a specific row address DRA234) at the row select circuit and at a lower side of the fuse circuit 330, as illustrated in FIGS. 11 and 12. In FIGS. 11 and 12, a two-layer structure of a fuse bank alleviates limitation in a row direction by dividing a fuse bank into sub-fuse banks and disposing the sub-fuse banks with a two-layer structure. An operating speed of a semiconductor memory device can be improved by decentralizing address loading capacitance.

As set forth above, a length of a fuse circuit can be minimized by forming both ends of each fuse with the same width, or both ends of each fuse such that one end (disposed at a cutting region) of each fuse has a narrower width than that of the other end thereof. Operating speed can be improved by disposing address signal lines having the largest line loading capacitance (e.g., address signal lines for transferring a specific row address DRA234) at a row select circuit and at,a lower side of a fuse circuit. The improvement of the operating speed can be accomplished by minimizing a length of a material (typically, polysilicon) forming a fuse so as to reduce its resistance.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A fuse arrangement comprising:
   a first fuse having a first end and a second end; and
   a second fuse having a first end and a second end; wherein:
   the first end of the first fuse is spaced by a first interval from the first end of the second fuse, and the second end of the first fuse is spaced by a second interval from the second end of the second fuse, the second interval being different than the first interval;
   the first ends of the first and second fuses have widths substantially the same as those of the second ends of the first and second fuses;
   the first ends of the first and second fuses are disposed at a cutting region;
   the first and second fuses have cutting portions at the first ends of the first and second fuses, the cutting portions being disposed in the cutting region; and
   the cutting portions of the first and second fuses have widths substantially the same as portions of the first and second fuses outside the cutting region.

2. The fuse arrangement according to claim 1, wherein the first interval is wider than the second interval.

3. The fuse arrangement according to claim 1, wherein the first ends of the first and second fuses are disposed in a row direction.

4. The fuse arrangement according to claim 2, wherein the first and second ends of the first fuse are connected in a straight line and the first end of the second fuse is laterally offset from the second end of the second fuse.

5. The fuse arrangement according to claim 4, further comprises a third fuse and a fourth fuse, the first and second fuses forming a first fuse group and the third and fourth fuses forming a second fuse group,
   wherein the second fuse group is positioned such that the second fuse group is adjacent to the first fuse group and the second fuse group is rotated one hundred eighty (180) degrees from the first fuse group.

6. The fuse arrangement according to claim 2, wherein the first ends of the first and second fuses are vertically connected to the second ends of the first and second fuses, respectively.

7. A fuse arrangement comprising:
   a first fuse having a first end and a second end connected in a straight line;
   a second fuse having a first end and a second end connected in a straight line;
   a third fuse having a first end spaced by a first interval from the first end of the first fuse and a second end spaced by a second interval from the second end of the first fuse, the first end of the third fuse being laterally offset from the second end thereof; and
   a fourth fuse having a first end spaced by the first interval from the first end of the second fuse and a second end spaced by the second interval from the second end of the second fuse, the first end of the fourth fuse being laterally offset from the second end thereof; wherein:
   the first ends of the first to fourth fuses have widths substantially the same as those of the second ends of the first to fourth fuses;
   the first to fourth fuses are disposed at a cutting region;
   the first to fourth fuses have cutting portions at the first ends of the first to fourth fuses, the cutting portions being disposed in the cutting region; and
   the cutting portions of the first to fourth fuses have widths substantially the same as portions of the first to fourth fuses outside the cutting region.

8. The fuse arrangement according to claim 7, wherein the first ends of the first and third fuses are disposed parallel in one row direction and the first ends of the second and fourth fuses are disposed parallel in another row direction.

9. The fuse arrangement according to claim 7, wherein the first interval is wider than the second interval.

10. The fuse arrangement according to claim 7, wherein the first ends of the first and third fuses are disposed at a first cutting region formed along a first row and the first ends of the second and fourth fuses are disposed at a second cutting region formed along a second row.

11. A fuse arrangement comprising:
a first fuse group including a plurality of first fuses each having a first end and a second end, wherein the first ends of the first fuses are spaced from one another, the first and second ends of one of the first fuses are connected in a straight line, and the first ends of remaining ones of the first fuses became laterally offset from the second ends thereof; and
a second fuse group including a plurality of second fuses each having a first end and a second end, wherein the first ends of the second fuses are spaced by a first interval from one another, the second ends of the second fuses are spaced by a second interval from one another, the first and second ends of one of the second fuses are connected in a straight line, and the first ends of remaining ones of the second fuses are laterally offset from the second ends thereof; wherein:
the first ends of the first and second fuses have widths substantially the same as those of the second ends of the first and second fuses;
the first and second fuses having the first and second ends connected in a straight line are disposed to encompass the remaining of the first and second fuses;
the first ends of the first and second fuses are disposed at a cutting region;
the first and second fuses have cutting portions at the first ends of the first and second fuses, the cutting portions being disposed in the cutting region; and
the cutting portions of the first and second fuses have widths substantially the same as portions of the first and second fuses outside the cutting region.

12. The fuse arrangement according to claim 11, wherein the first ends of the first fuses are disposed parallel in one row direction and the first ends of the second fuses are disposed parallel in another row direction.

13. The fuse arrangement according to claim 11, wherein the first interval is wider than the second interval, the first ends of the first fuses are disposed at a first cutting region farmed along a first row, and the first ends of the second fuses are disposed at a second cutting region farmed along a second row.

14. A semiconductor memory device comprising:
an array of memory cells arranged in rows and columns;
a redundant array for replacing defective memory cells; and
a plurality of fuse boxes for storing defect addresses, respectively wherein:
each fuse box includes a first fuse having a first end and a second end connected in a straight line and a second fuse having a first end spaced by a first interval from the first end of the first fuse and a second end spaced by a second interval from the second end of the first fuse; and
the first ends of the first and second fuses have widths substantially the same as those of the second ends of the first and second fuses, the first ends of the first and second fuses are disposed at a cutting region along a row direction, the first and second fuses have cutting portions at the first ends of the first and second fuses, the cutting portions being disposed in the cutting region, and the cutting portions of the first and second fuses have widths substantially the same as portions of the first and second fuses outside the cutting region, the first end of the second fuse is laterally offset from the second end of the second fuse.

15. The semiconductor memory device according to claim 14, wherein each fuse box further comprises a second fuse group having third and fourth fuses, the second fuse group is positioned such that a first fuse group of the first anti second fuses is adjacent to the second fuse group and the second fuse group is rotated one hundred eighty (180) degrees from the first fuse group.

16. The semiconductor memory device according to claim 15, wherein the third and fourth fuses are disposed to have the same structure as the first and second fuses.

* * * * *

UNITED STATES PATENT AND TRADEMARK OFFICE
CERTIFICATE OF CORRECTION

| | | |
|---|---|---|
| PATENT NO. | : 7,057,217 B2 | Page 1 of 1 |
| APPLICATION NO. | : 10/672035 | |
| DATED | : June 6, 2006 | |
| INVENTOR(S) | : Sang-Seok Kang et al. | |

It is certified that error appears in the above-identified patent and that said Letters Patent is hereby corrected as shown below:

In Claim 15, Column 12, Line 32, delete "anti" and insert --and--.

Signed and Sealed this

Fourteenth Day of November, 2006

JON W. DUDAS
*Director of the United States Patent and Trademark Office*